(12) United States Patent
Tsai et al.

(10) Patent No.: US 12,484,446 B2
(45) Date of Patent: Nov. 25, 2025

(54) FIR INFRARED (FIR) SENSOR WITH TWO ABSORPTION LAYERS

(71) Applicant: PIXART IMAGING INC., Hsin-Chu County (TW)

(72) Inventors: Ming-Han Tsai, Hsin-Chu County (TW); Chih-Fan Hu, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 744 days.

(21) Appl. No.: 17/739,780

(22) Filed: May 9, 2022

(65) Prior Publication Data
US 2023/0031112 A1 Feb. 2, 2023

(30) Foreign Application Priority Data
Jul. 27, 2021 (TW) ................................. 110127581

(51) Int. Cl.
| | |
|---|---|
| *H10N 19/00* | (2023.01) |
| *G01J 5/12* | (2006.01) |
| *G01J 5/14* | (2006.01) |
| *H10N 10/01* | (2023.01) |
| *H10N 10/13* | (2023.01) |
| *H10N 10/851* | (2023.01) |

(52) U.S. Cl.
CPC ................ *H10N 19/00* (2023.02); *G01J 5/14* (2013.01); *H10N 10/01* (2023.02); *H10N 10/13* (2023.02); *G01J 2005/123* (2013.01); *H10N 10/851* (2023.02); *H10N 19/101* (2023.02)

(58) Field of Classification Search
CPC ...................................... H10N 19/00
See application file for complete search history.

(56) References Cited

U.S. PATENT DOCUMENTS

2012/0227780 A1* 9/2012 Kurihara ................ H10N 10/17
136/224
2021/0134879 A1* 5/2021 Chiu ...................... H10N 10/17

FOREIGN PATENT DOCUMENTS

CN 110044494 B 4/2021

\* cited by examiner

*Primary Examiner* — Shih Tsun A Chou
(74) *Attorney, Agent, or Firm* — HAUPTMAN HAM, LLP

(57) ABSTRACT

There is provided a far infrared (FIR) sensor device including a substrate, a thermopile structure and a heat absorption layer. The thermopile structure is arranged on the substrate. The heat absorption layer covers upon the thermopile structure, wherein the heat absorption layer has a hollow space which is formed by etching a metal layer in the heat absorption layer.

11 Claims, 14 Drawing Sheets

FIR INFRARED (FIR) SENSOR WITH TWO ABSORPTION LAYERS

CROSS REFERENCE TO RELATED APPLICATION

This application claims the priority benefit of Taiwan Patent Application Serial Number 110127581, filed on Jul. 27, 2021, and the full disclosure of which is incorporated herein by reference.

BACKGROUND

1. Field of the Disclosure

This disclosure generally relates to a thermometer structure and, more particularly, to a far infrared (FIR) sensor having two absorption layers to improve the heat absorption efficiency and a manufacturing method thereof.

2. Description of the Related Art

FIG. 1 shows a cross sectional view of a conventional far infrared (FIR) sensing structure 1. The FIR sensing structure 1 includes an FIR sensor 10 and a peripheral circuit 15. The FIR sensor 10 is formed on a substrate 11 and has a sensing region 16. The sensing region 16 can detect FIR light. The FIR sensor 10 includes a dielectric layer 12, and the sensing region 16 is inside the dielectric layer 12. The sensing region 16 has a stack structure 161 and partition structures 162 and 163. The partition structures 162 and 163 are termed as a ring structure and surrounding the stack structure 161. The stack structure 161 and the partition structures 162 and 163 respectively include polysilicon layers poly 1 and poly 2.

The FIR structure is manufactured by CMOS manufacturing process, and the substrate 11 is further formed with a peripheral circuit 15, wherein the peripheral circuit 15 includes at least one metal oxide semiconductor (MOS) device 17, multiple metal layers M1 to M4 and multiple vias V0. The multiple vias V0 are used to electrically connect the multiple metal layers M1 to M4 and the MOS device 17.

However, in the conventional FIR sensor 10, a thickness ho of the dielectric layer 12 above the sensing region 16 cannot be easily adjusted due to the CMOS manufacturing process such that it is not able to accurately control and calibrate the sensing efficiency and frame rate of the FIR sensor 10.

Accordingly, the present disclosure further provides an FIR sensor with thinner heat absorption layer to improve the absorption efficiency and a manufacturing method thereof.

SUMMARY

One objective of the present disclosure is to provide an FIR sensor having improved heat absorption efficiency by reducing a volume of a heat absorption layer and arranging multiple heat absorption layers, and a manufacturing method of the FIR sensor.

Another objective of the present disclosure is to provide an FIR sensor having a wider absorbable FIR spectrum by arranging a nitride silicon layer on a heat absorption layer, and a manufacturing method of the FIR sensor.

To achieve the above objective, the present disclosure provides an FIR sensor including a substrate, a thermopile structure and a heat absorption layer. The thermopile structure is arranged on the substrate. The heat absorption layer covers upon the thermopile structure, and includes a first heat absorption layer stacking on a second heat absorption layer, wherein the first heat absorption layer and the second heat absorption layer are connected by a connection layer, and a cross section of the connection layer is smaller than cross sections of the first heat absorption layer and the second heat absorption layer.

Besides, the present disclosure further provides a manufacturing method of an FIR sensor including the steps of: forming a thermopile structure on a substrate; forming a first metal layer upon the thermopile structure and partially overlapping with the thermopile structure; forming a blocking layer upon the thermopile structure and opposite to the thermopile structure; forming a second metal layer upon the blocking layer and opposite to the blocking layer, wherein the thermopile structure, the first metal layer, the blocking layer and the second metal layer are encapsulated in a dielectric layer; etching from a surface of the dielectric layer to the first metal layer, the second metal layer and the substrate using a first etching process; and removing the first metal layer, the second metal layer and a part of the substrate under the thermopile structure using a second etching process such that the dielectric layer between the thermopile structure and the blocking layer forms a double-layer heat absorption layer.

Besides, the present disclosure further provides an FIR sensor including a substrate, a thermopile structure and a heat absorption layer. The thermopile structure is arranged on the substrate. The heat absorption layer covers upon the thermopile structure, and includes a hollow space formed after a metal layer in the heat absorption layer is etched.

In the FIR sensor of the present disclosure, by arranging different sacrificial metal layers in a heat absorption layer, it is able to remove the dielectric layer with different shapes and regions in the heat absorption layer.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The far infrared (FIR) sensor of the present disclosure has improved heat absorption efficiency by removing a part of dielectric layer in a heat absorption layer to form a hollow space and arranging multiple heat absorption layers in a propagation direction of infrared light. Furthermore, a silicon nitride ($Si_2N_4$) layer is further arranged on the heat absorption layer to increase an absorption spectrum of infrared light.

Figure 1:
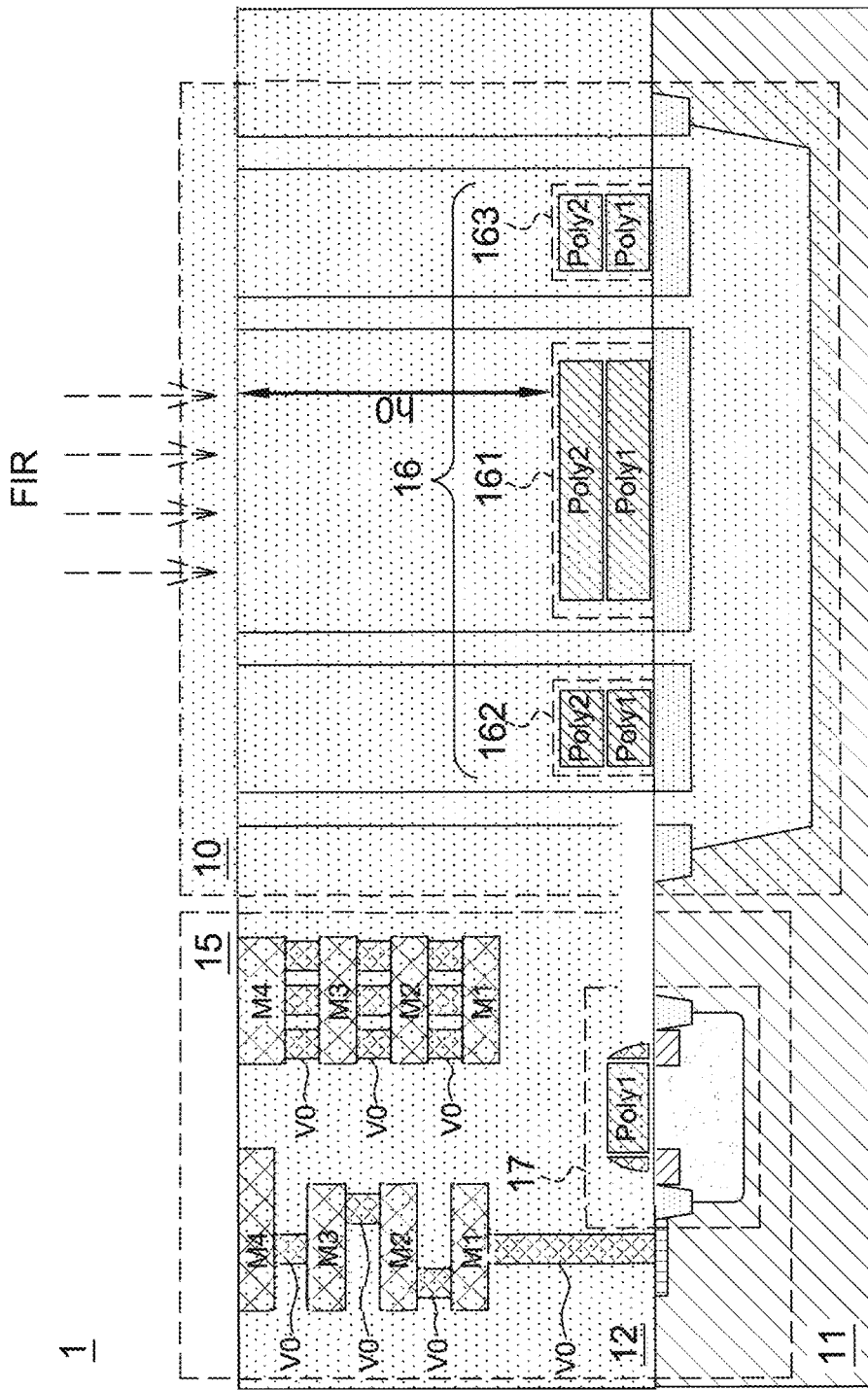
FIG. 1 is a cross sectional view of a conventional FIR sensing structure.
Figure 2:
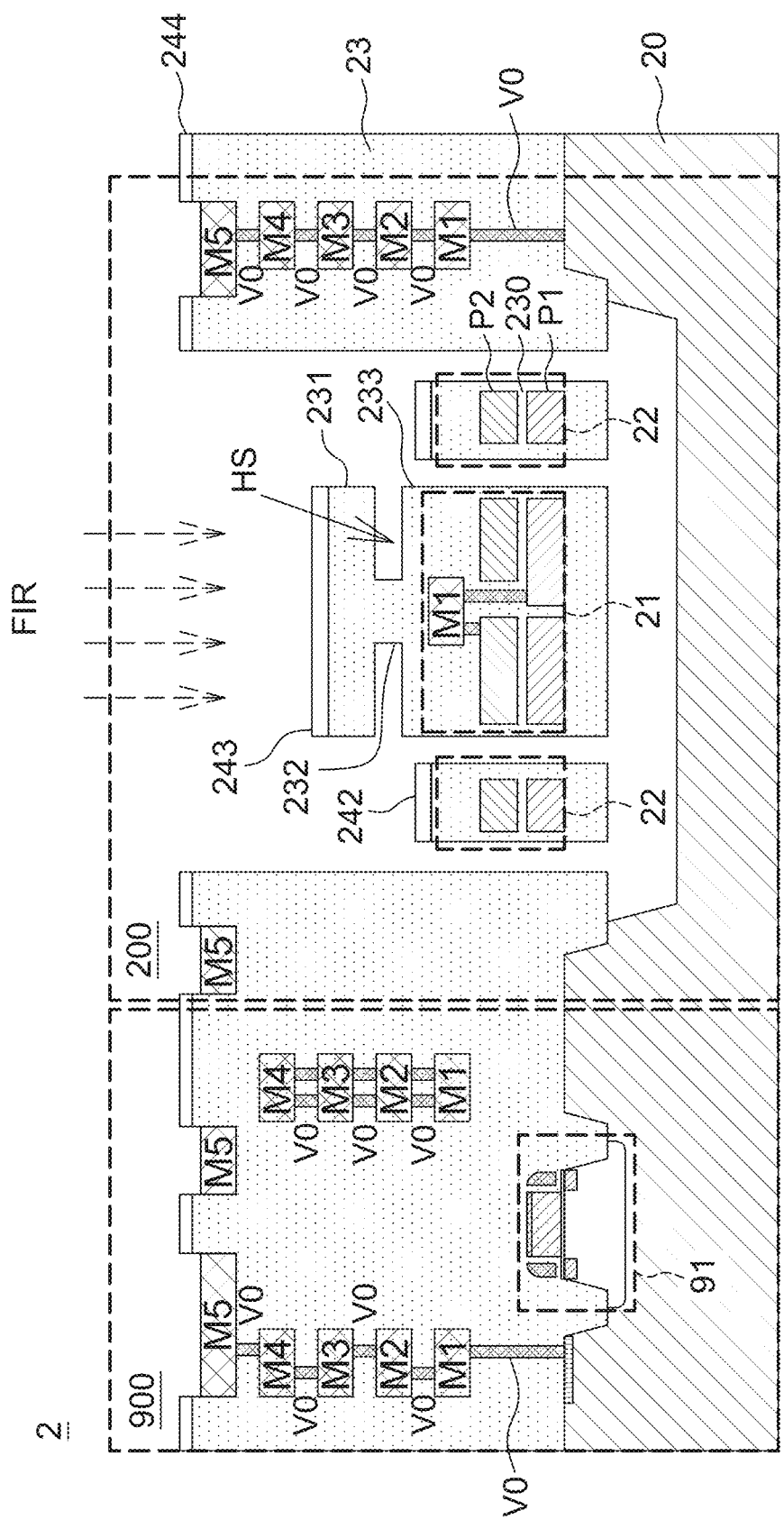
FIG. 2 is a cross sectional view of an FIR sensor according to an embodiment of the present disclosure.

Please refer to FIG. 2, it is a cross sectional view of a far infrared (FIR) sensor device 2 according to an embodiment of the present disclosure. The FIR sensor 2 includes a substrate 20, as well as an FIR sensing device (sometimes referred to sensing device) 200 and a peripheral circuit 900 forming on the substrate 20. The FIR sensor 2 shown in FIG. 2 is a micro-electromechanical system (MEMS) structure having two polysilicon layers and five stacked metal layers manufactured by the standard CMOS manufacturing process.

The peripheral circuit 900 includes, for example, a metal oxide semiconductor (MOS) device 91, multiple metal layers M1 to M5 (hut not limited to 5 layers; possibly having 4 layers, 6 layers or more than 6 layers) and multiple vias V0, wherein these components are buried in a dielectric layer 23. The vias V0 are used to connect the metal layers M1 to M5 and the MOS device 91. The method of manufacturing the MOS device 91 using the CMOS manufacturing process is known to the art and not a main objective of the present disclosure, and thus is not described herein.

The sensing device 200 includes a thermopile structure 21, a partition structure 22, a heat absorption layer (referring to a part of the dielectric layer 23 encapsulating and above the thermopile structure 21), multiple blocking layers 242 to 244 (functions thereof being described hereinafter) and multiple metal layers M1 to M5. In one aspect, the multiple metal layers M1 to M5 in the sensing device 200 are manufactured by the same CMOS manufacturing process as the multiple metal layers M1 to M5 in the peripheral circuit 900.

The partition structure 22 is arranged on the substrate 20 for separating each pixel of the FIR sensor 2 from other pixels, wherein each pixel includes, for example, multiple cascaded thermocouples to form the thermopile structure 21. The partition structure 22 includes a first polysilicon layer P1 and a second polysilicon layer P2 separated by a dielectric layer 230. Seeing from above of the FIR sensor 2, the thermopile structure 21, for example, has a rectangular shape, and the partition structure 22 surrounds the thermopile structure 21 and is arranged between pixels.

The thermopile structure 21 is arranged on the substrate 20. The substrate 20 is, for example, a silicon substrate, but can also use material used in the substrate in conventional MEMS structures without being limited to the silicon substrate. The thermopile structure 21 includes a first polysilicon layer P1 and a second polysilicon layer P2 (e.g., formed by the same CMOS manufacturing process as the first polysilicon layer P1 and the second polysilicon layer P2 in the partition structure 22, but not limited to) stacked to each other, wherein the first polysilicon layer P1 and the second polysilicon layer P2 have different Seebeck coefficients. A dielectric layer 230 (e.g., silicon oxide, but not limited to) is sandwiched between the first polysilicon layer P1 and the second polysilicon layer P2 for separation purpose. A metal layer (e.g., M1) is connected to the first polysilicon layer P1 and the second polysilicon layer P2 respectively using a via V0 to form a thermocouple. The method of forming a thermopile by connecting multiple thermocouples is known to the art, and thus is not described.

The heat absorption layer (e.g., formed by the dielectric layer 23) encapsulates the thermopile structure 21 and is arranged thereon for absorbing heat energy of far infrared light and transmit the absorbed heat energy to the thermopile structure 21. In the present disclosure, there is a hollow space HS formed after a metal layer (e.g., the metal layer M2 mentioned below, but not limited to) in the heat absorption layer is etched so as to reduce a total volume of the heat absorption layer.

In one aspect, the hollow space HS is aligned with one of the metal layers M1 to M5 in a transverse direction (e.g., left-right direction in FIG. 2), e.g., aligned with the metal layer M2 shown in FIG. 2. In another aspect, the hollow space HS is not aligned with any one of the metal layers M1 to M5 in the transverse direction, e.g., formed by deposition and patterning processes different from the metal layers M1 to M5 in the CMOS manufacturing process.

Figure 4:
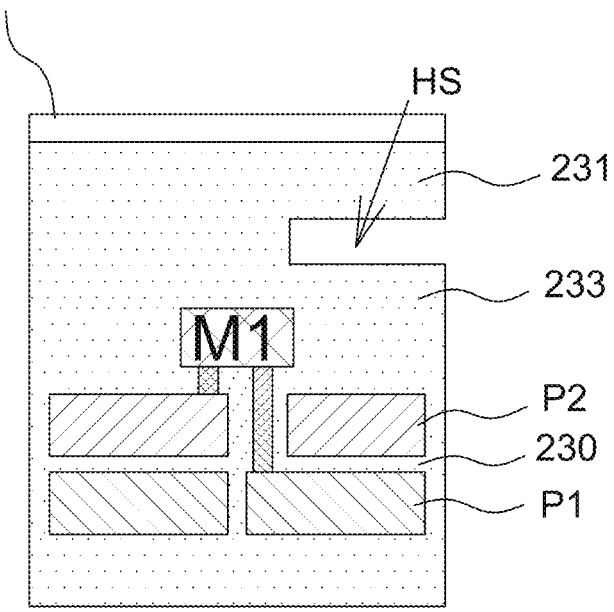
FIG. 4 is a cross sectional view of an FIR sensor according to another embodiment of the present disclosure.
Figure 5:
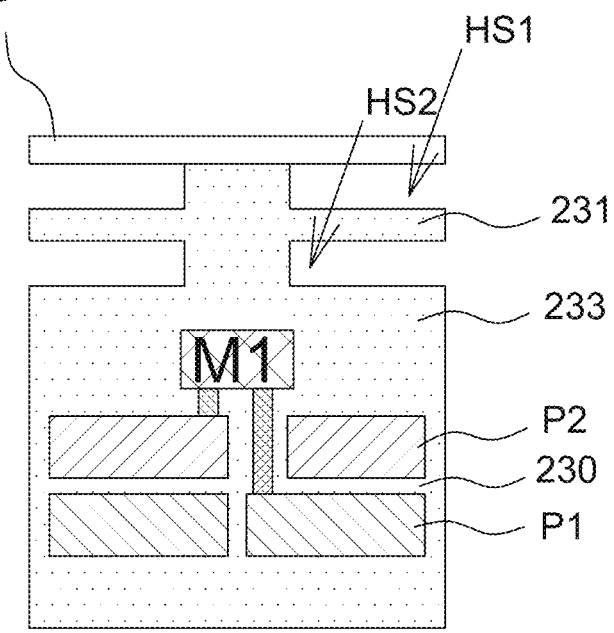
FIG. 5 is a cross sectional view of an FIR sensor according to an alternative embodiment of the present disclosure.

In other aspects, the hollow space HS is formed only at one side of the heat absorption layer as shown in FIG. 4; or multiple layers of hollow spaces are formed inside the heat absorption layer, e.g., HS1 and HS2 shown in FIG. 5. More specifically, the hollow space HS is arranged to have different shapes and volumes in the heat absorption layer according to different applications without particular limitations as long as the total volume of the heat absorption layer is reduced.

In one aspect, the heat absorption layer includes a first heat absorption layer 231 stacked upon a second heat absorption layer 233, wherein the first heat absorption layer 231 and the second heat absorption layer 233 are connected by a connection layer 232. A cross section of the connection layer 232 is smaller than (e.g., between ⅕ and 1/10, but not limited to) cross sections of the first heat absorption layer 231 and the second heat absorption layer 233, e.g., having a shape of dumbbells.

For example, a width of the connection layer 232 is smaller than 10 micrometers. In products nowadays, a pixel size is about 80 micrometers.

As mentioned above, since the connection layer 232 is formed by etching a sacrificial metal layer in the dielectric layer 23, the connection layer 232 is aligned with or not aligned with one of the metal layers M1 to M5 in a transverse direction depending on whether the sacrificial metal layer is one of the metal layers M1 to M5 or not.

Furthermore, a blocking layer (e.g., silicon nitride) 243 is further arranged on an upper surface of the heat absorption layer (more specifically the first heat absorption layer 231), and the blocking layer 243 is used as an etch stop layer. The silicon nitride layer 243 has an absorption spectrum between 8 micrometers and 10 micrometers. The silicon dioxide layer (i.e. heat absorption layer) has an absorption spectrum between 10 micrometers and 12 micrometers. Accordingly, an absorbable spectrum range of the sensing device 200 is increased to further improve the heat collection efficiency. In addition, to reduce the total volume of the heat absorption layer, a height of the blocking layer 243 in a longitudinal direction is lower than a top layer M5 among the multiple metal layers M1 to M5. For example, the blocking layer 243 is between the metal layers M2 and M3, or between the metal layers M3 and M4, or between the metal layers M4 and M5 without particular limitations.

Please refer to FIGS. 3A to 3K, procedures of manufacturing the FIR sensor 2 of the present disclosure are illustrated hereinafter.

Figure 3A:
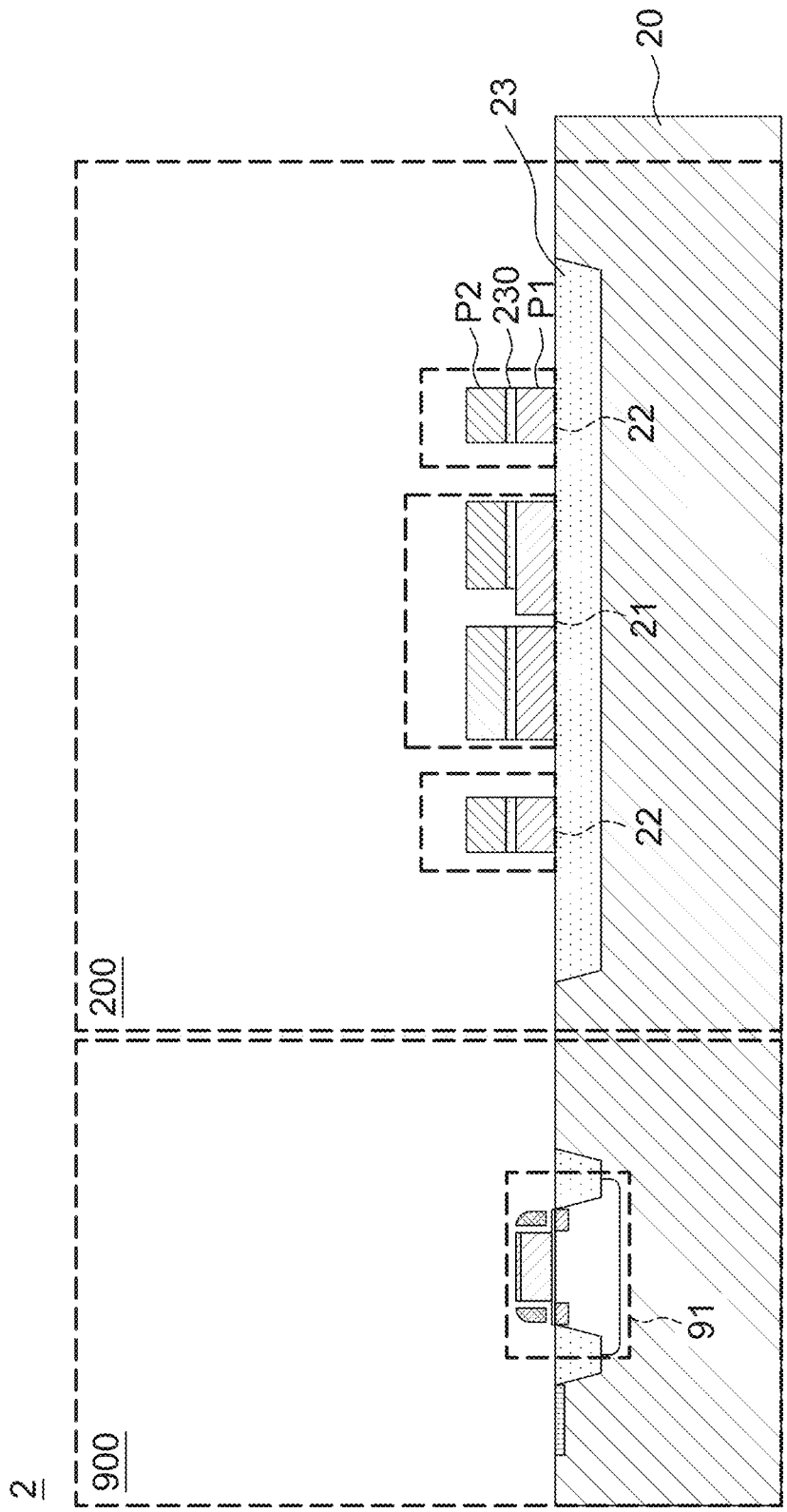
FIGS. 3A to 3K are flow charts of manufacturing an FIR sensor according to the embodiment of the present disclosure.

As shown in FIG. 3A, firstly a dielectric layer 23 is formed on the substrate 20. The dielectric layer 23 is, for example, a silicon dioxide formed by thermal oxide growing process, a undoped silicon glass (USG) formed by PECVD deposition, phosphosilicate glass (PSG) or borophosphosilicate glass (BPSG), and is used as a heat conducting layer.

Next, a first polysilicon layer P1, a dielectric layer 230 and a second polysilicon layer P2 used as a thermopile structure 21 and a partition structure 22 of the FIR sensing device 200 is deposited and patterned on the dielectric layer 23. The material of the dielectric layer 230 is, for example, silicon oxide, but not limited to. The first polysilicon layer P1 and the second polysilicon layer P2 have different Seebeck coefficients. As mentioned above, the partition structure 22 is used to separate different pixels. In other words, multiple FIR sensing devices 200 are manufactured on the substrate 20 at the same time.

Meanwhile, a peripheral circuit 900, e.g., MOS device 91, is further manufactured on the substrate 20, wherein the method of forming the MOS device 91 on the substrate 20 by the CMOS manufacturing process is known to the art and thus Is not described herein.

Figure 3B:
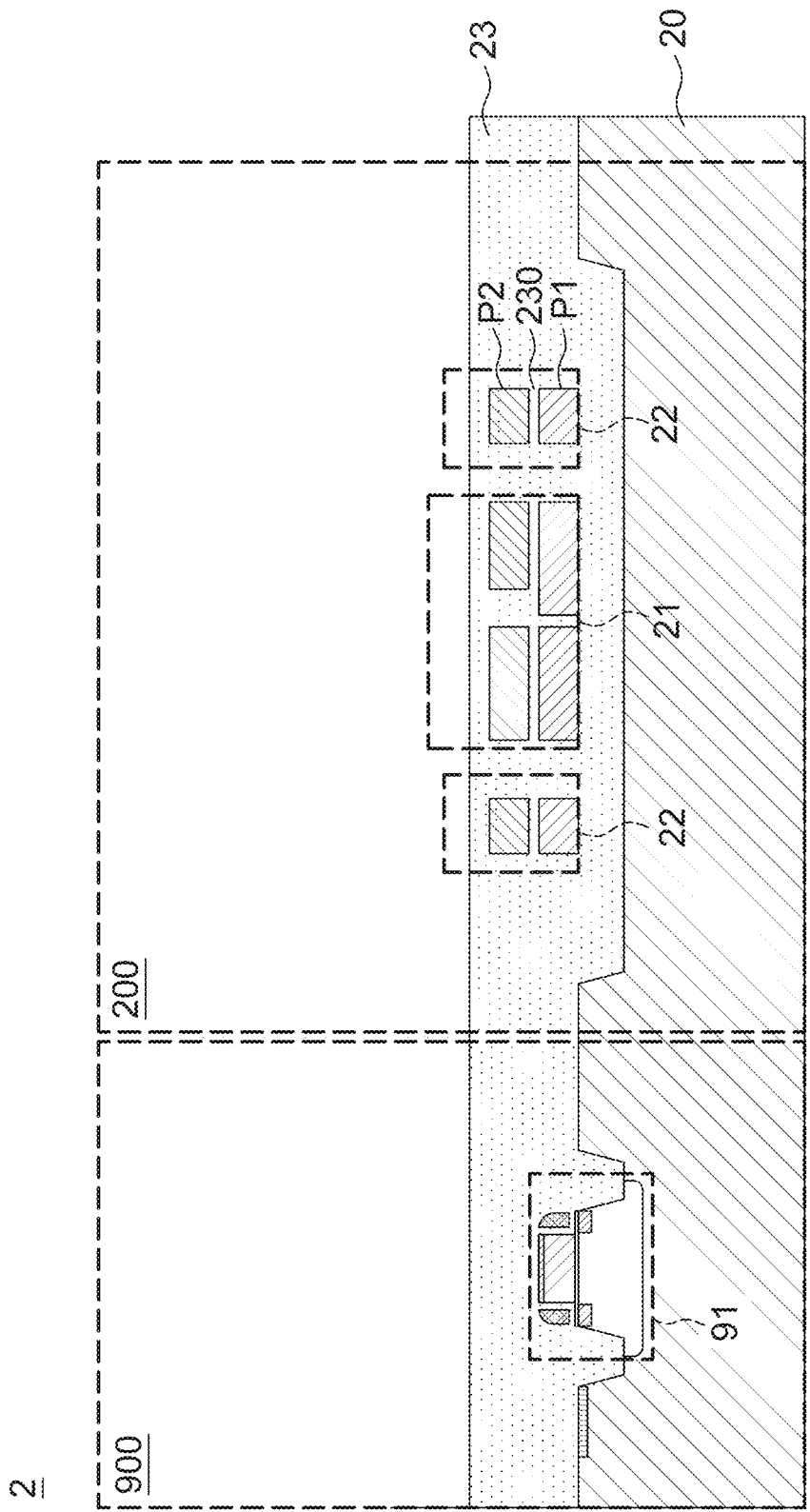

As shown in FIG. 3B, another dielectric layer 23 is then deposited on the substrate 20 so as to bury the MOS device 91, the thermopile structure 21 and the partition structure 22 in the dielectric layer 23. The method of forming the dielectric layer 23 is similar to the above descriptions and thus is not repeated.

Figure 3C:
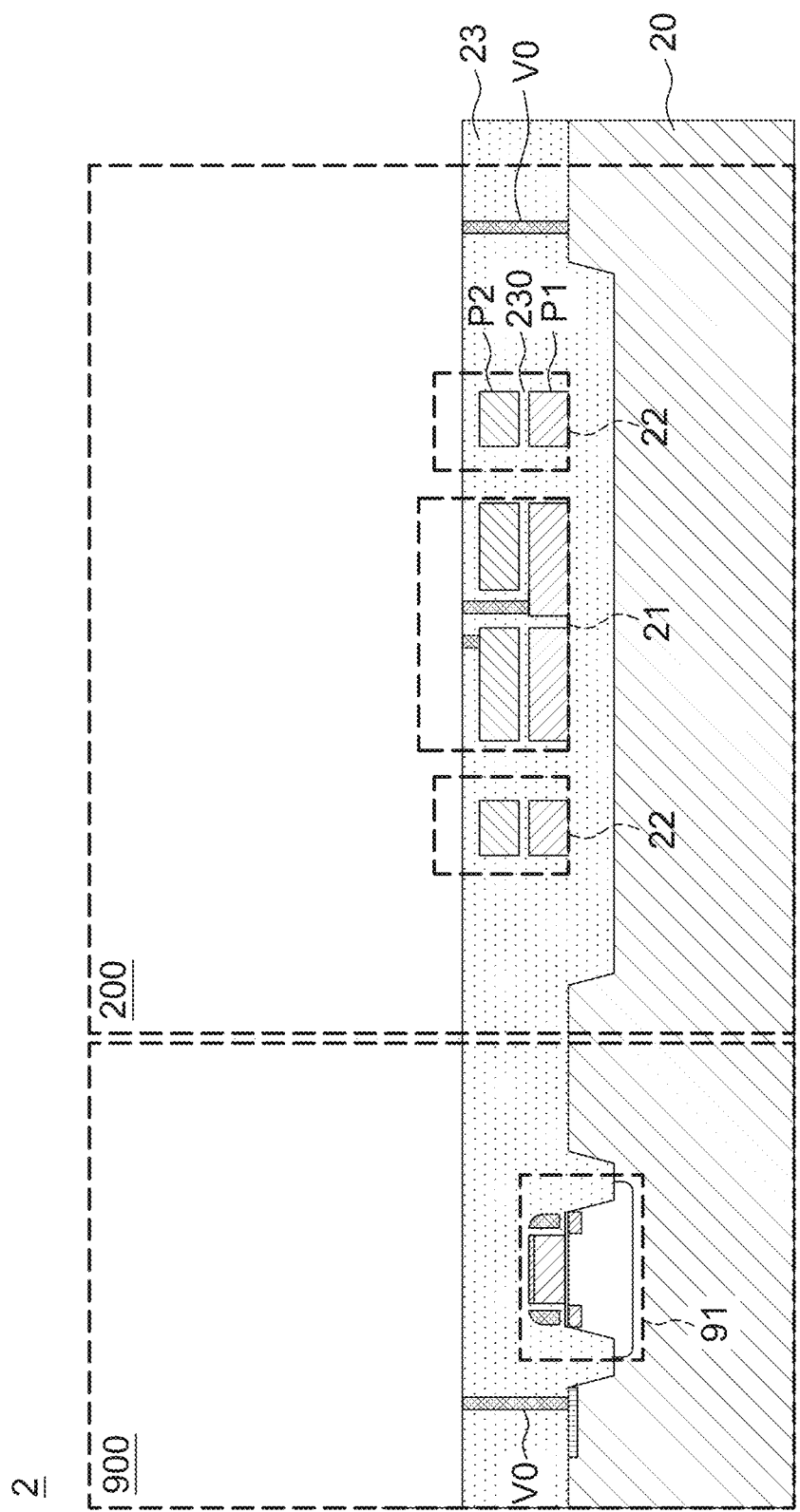

As shown in FIG. 3C, multiple longitudinal vias V0 are formed inside the dielectric layer 23 to connect the MOS device 91, the first polysilicon layer P1 and the second polysilicon layer P2. The multiple vias V0 are electric conducting metal such as tungsten, polysilicon, aluminum, copper or AlCu alloy, but not limited to. The method of forming vias V0 in the dielectric layer 23 is known to the art, and thus is not described herein.

Figure 3D:
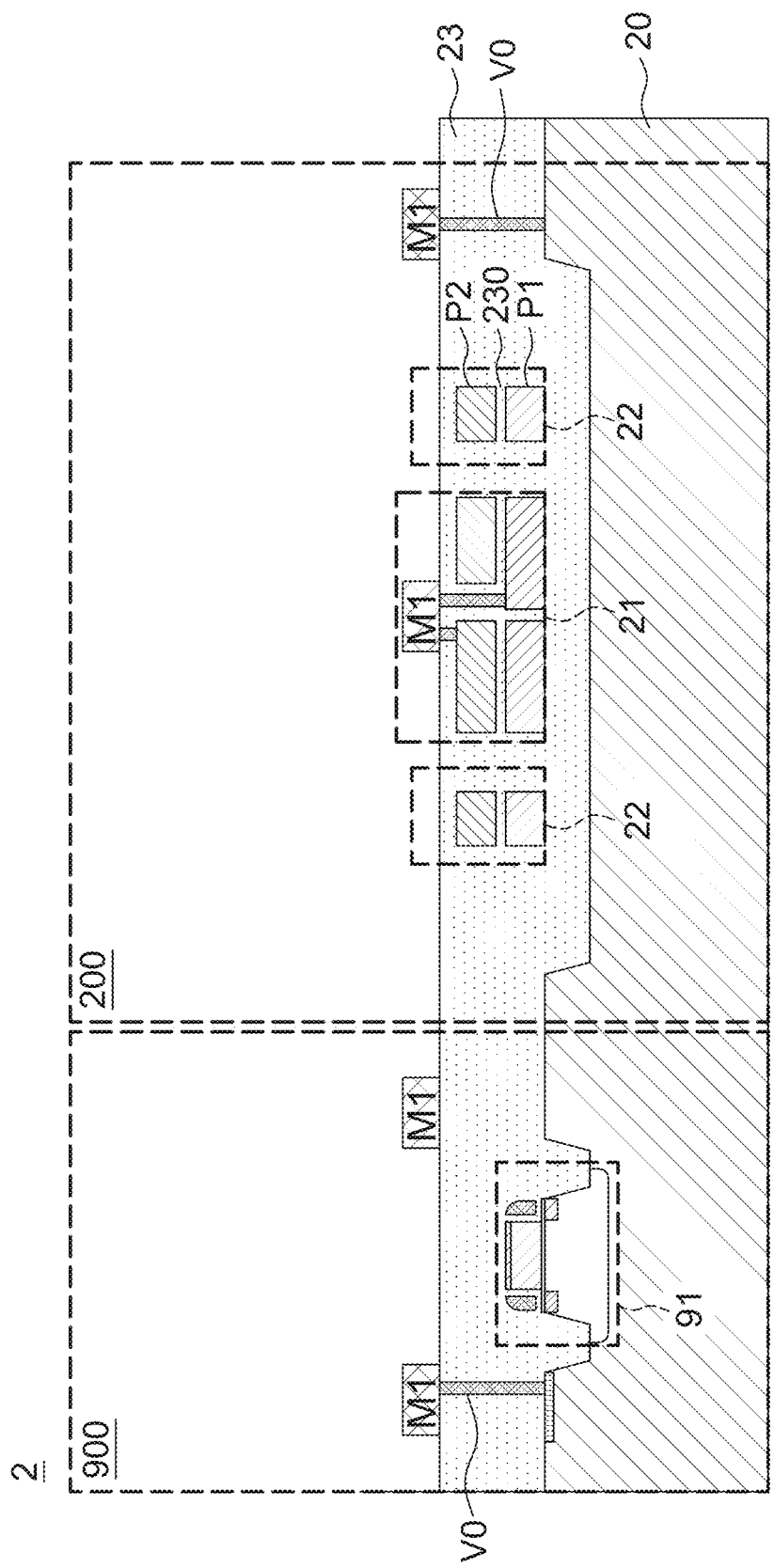

As shown in FIG. 3D, a metal layer M1 is then deposited and patterned on a surface of the dielectric layer 23. The metal layer M1 is electrically connected to the vias V0. In this process, a thermopile structure 21 is formed on the substrate 20, and the thermopile structure 21 is consisted of the metal layer M1 connecting to the two polysilicon layers having different Seebeck coefficients respectively using a via V0.

Figure 3E:
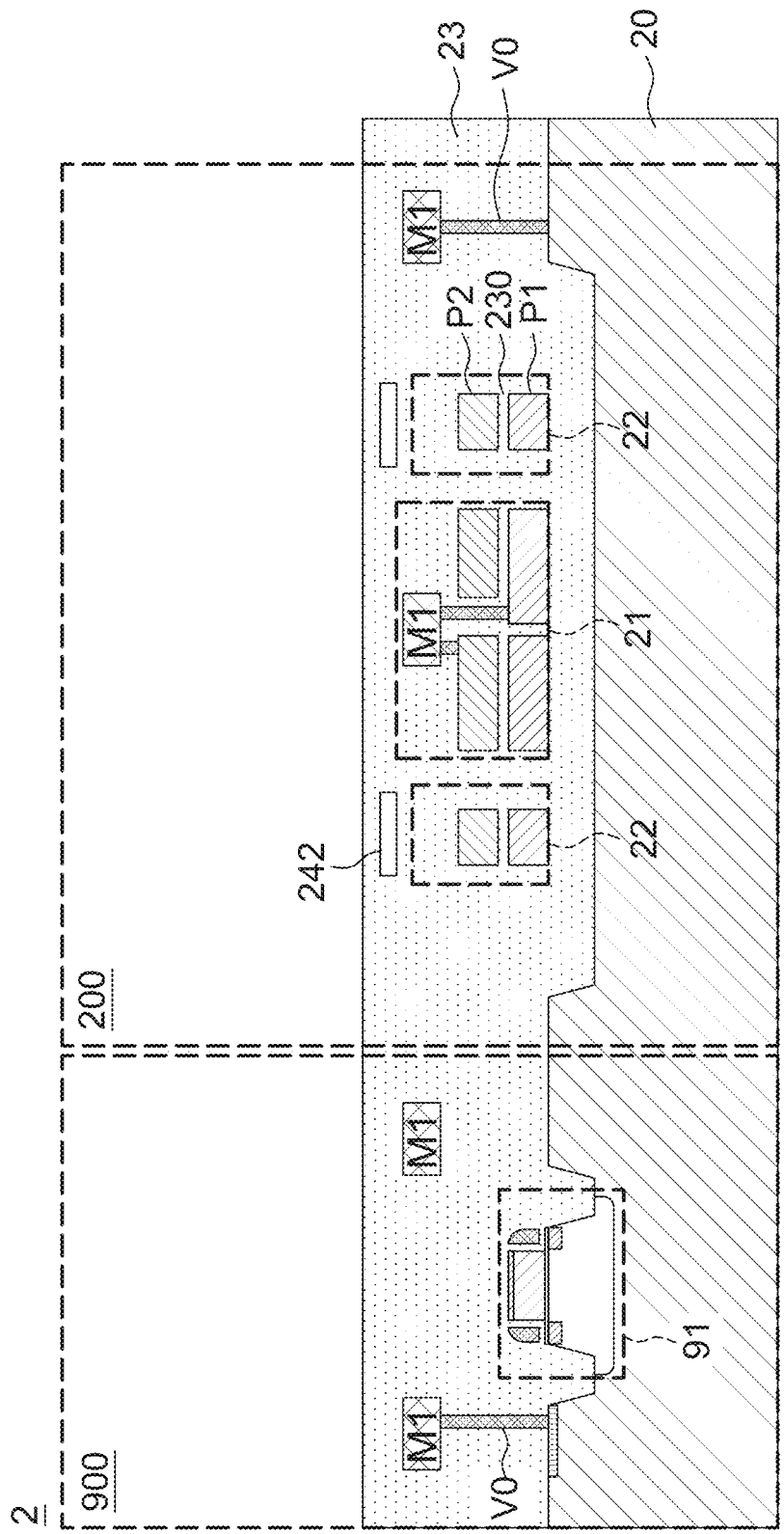

As shown in FIG. 3E, after covering the metal layer M1 by a dielectric layer 23, a blocking layer 242 is deposited and patterned, and then the blocking layer 242 is further covered by another dielectric layer 23. The blocking layer 242 is used as a etch stop layer is the following etching process. The method of forming the dielectric layer 23 is identical to the above descriptions and thus is not repeated herein.

Figure 3F:
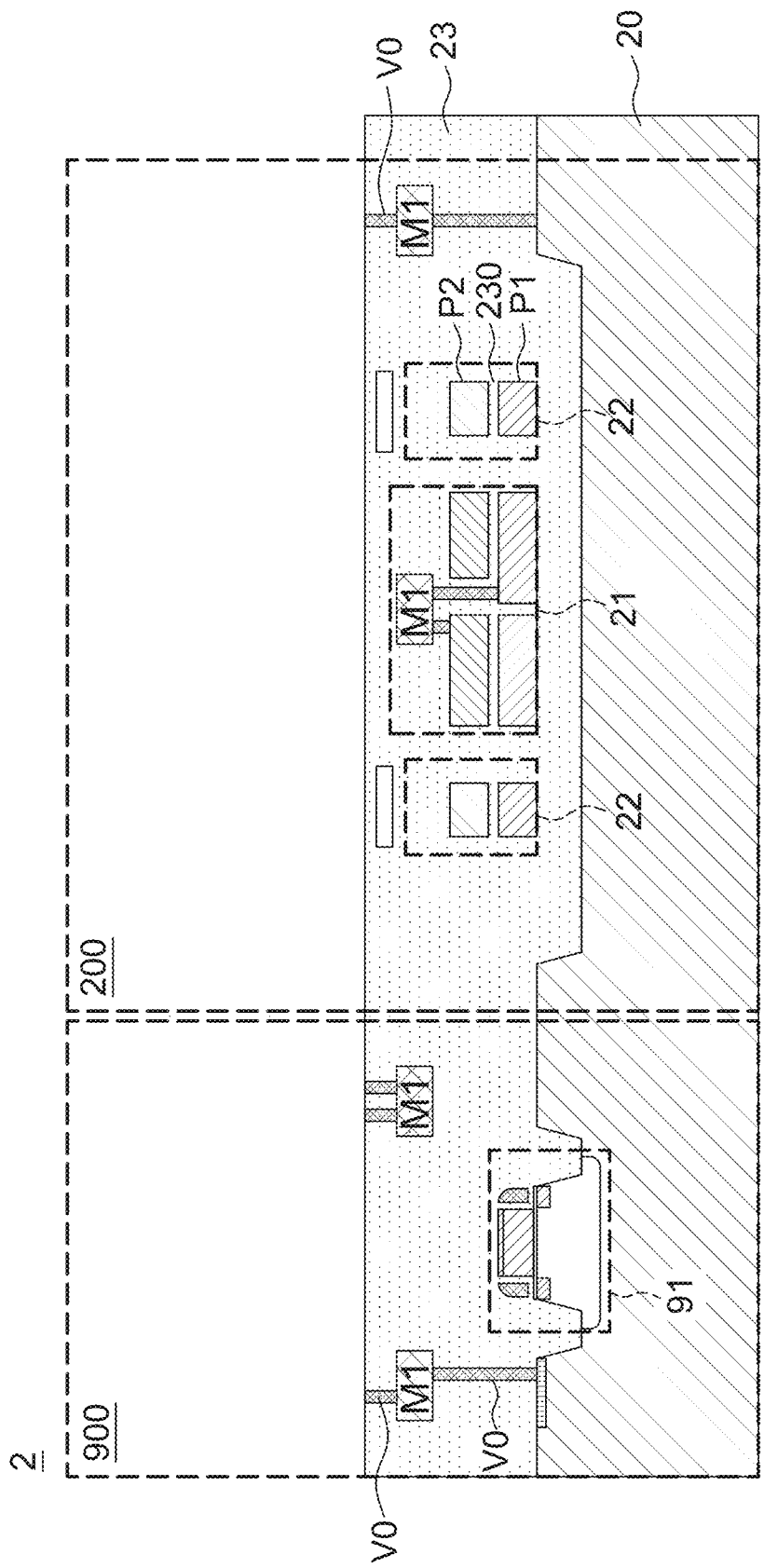

As shown in FIG. 3F, another layer of vias V0 is then formed in the dielectric layer 23 to electrically connect to the meal layer M1.

Figure 3G:
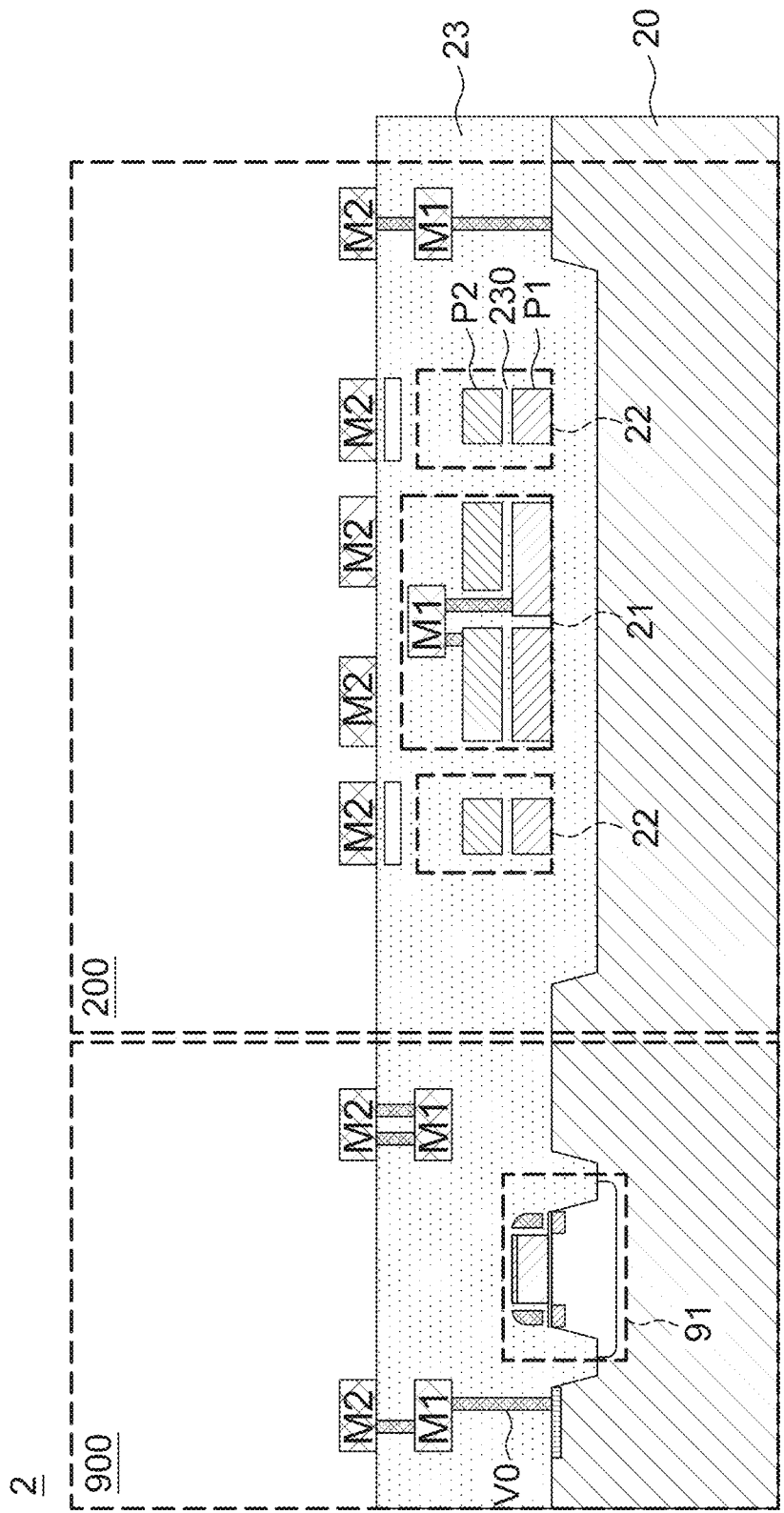

As shown in FIG. 3G, a metal layer M2 is then deposited on a surface of the dielectric layer 23. The metal layer M2 is partially overlapped with the thermopile structure 21, e.g., the metal layer M2 not overlapping with the metal layer M1. In the present disclosure, the metal layer M2 is used to define the connection layer 232. For example, a part of the metal layer M2 forms a ring shape above the thermopile structure 21.

Figure 3H:
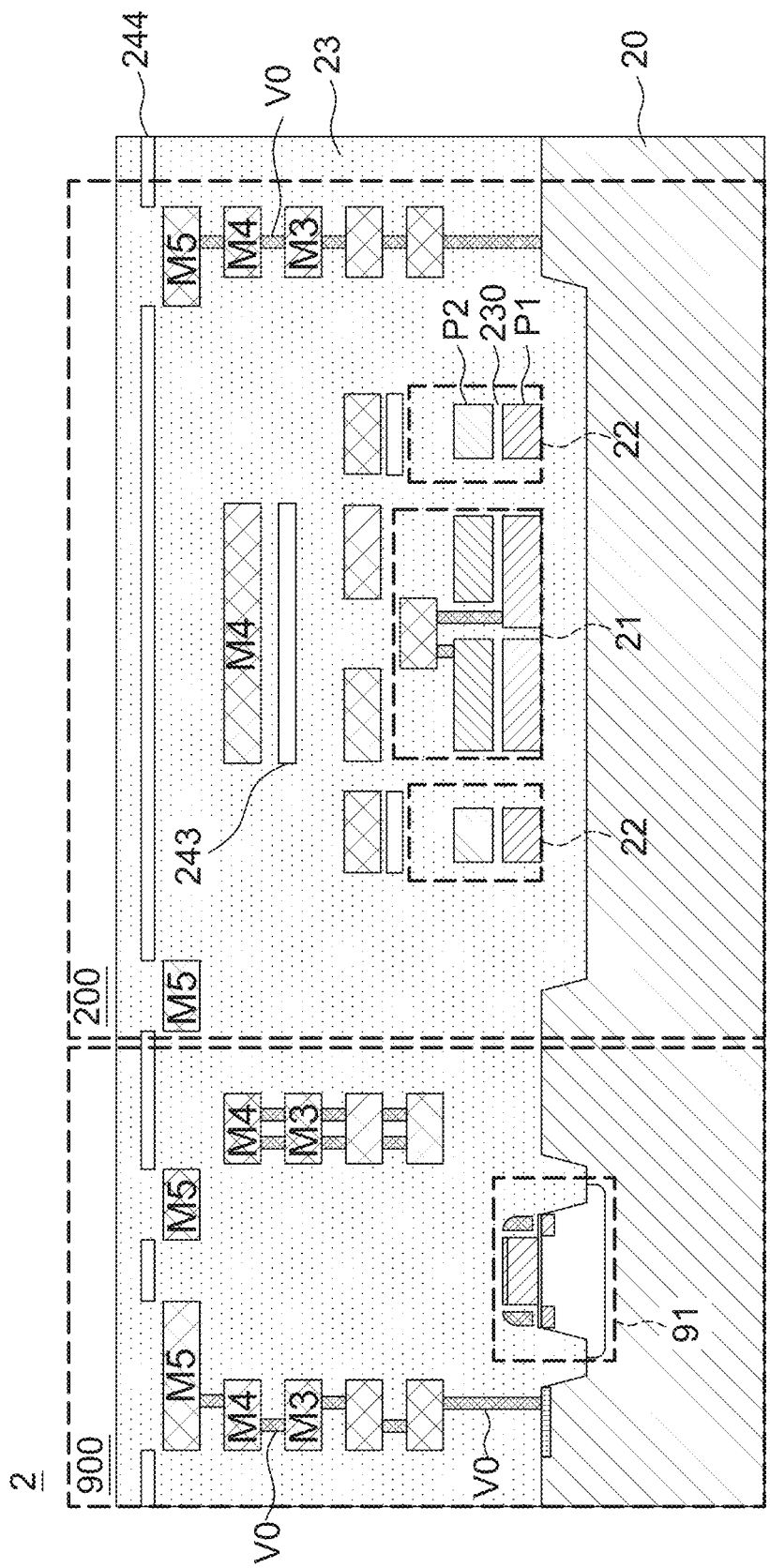

As shown in FIG. 3H, using the processes similar to FIGS. 3C to 3G, multiple metal layers M3, M4 and M5 as well as multiple vias V0 connecting the multiple metal layers M3, M4 and M5 are then sequentially formed in the dielectric layer 23 on the substrate 20 using the CMOS manufacturing process. A blocking layer 243 is formed above the thermopile structure 21 and opposite to the thermopile structure 21. The blocking layer 243 is used as an etch stop layer in the following etching process. A part of the metal layer M4 is arranged above the blocking layer 243. Furthermore, another blocking layer 244 not overlapping with the metal layer M5 is formed upon the metal layer M5.

After the process of FIG. 3H is accomplished, the dielectric layer 23 encapsulates the thermopile structure 21, the partition structure 22, multiple metal layers M1 to M5, multiple blocking layers 242 to 244, multiple vias V0 and the MOS device 91.

In the present disclosure, the dielectric layer 23 is formed by multiple times using identical process and material, and thus all dielectric layers mentioned above are indicated by the same reference numeral 23.

Figure 3I:
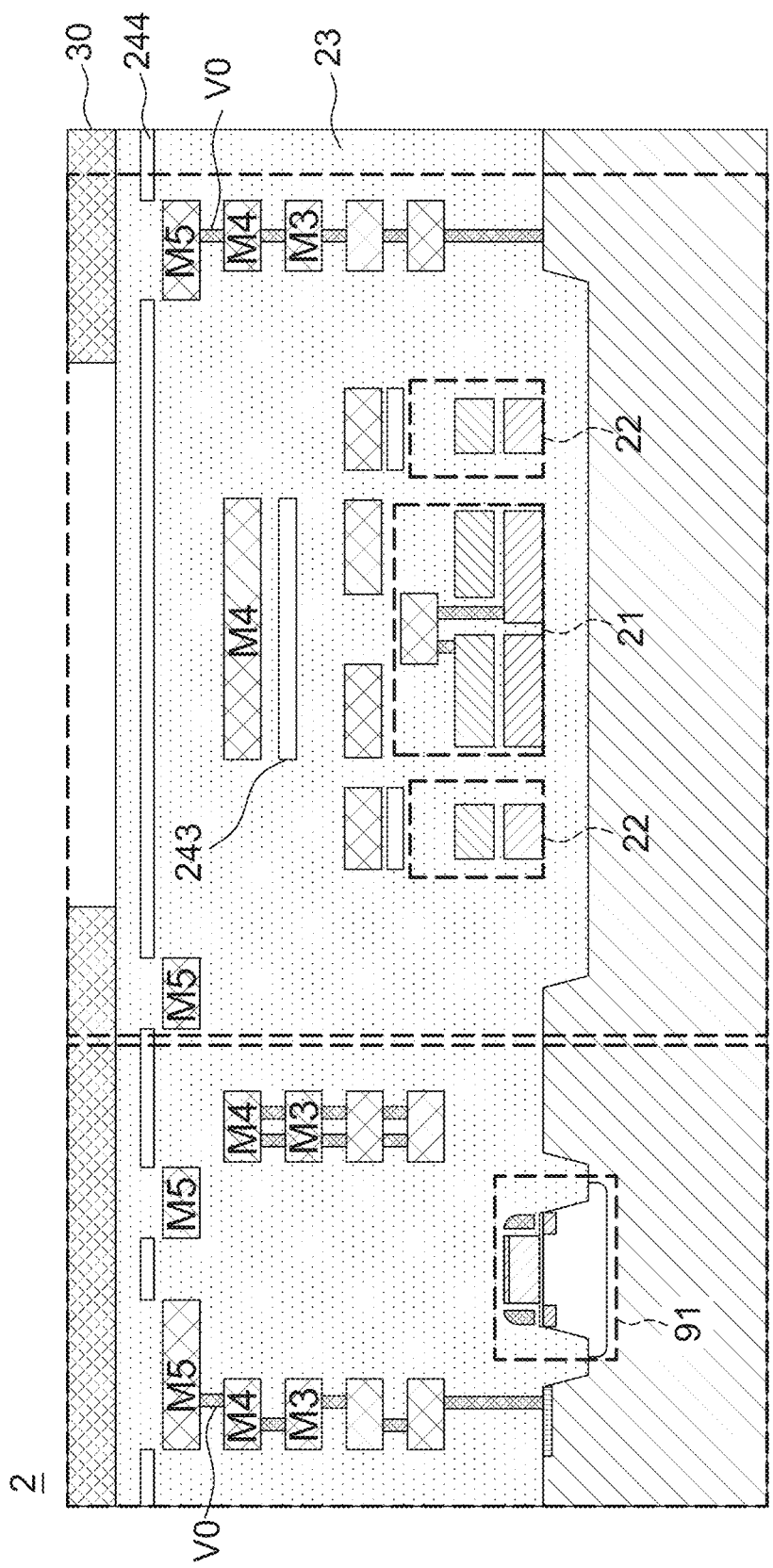

As shown in FIG. 3I, before the etching is started, a photoresist layer 30 is formed on an upper surface of the dielectric layer 23. The photoresist layer 30 does not cover regions above the thermopile structure 21 and the partition structure 22.

Figure 3J:
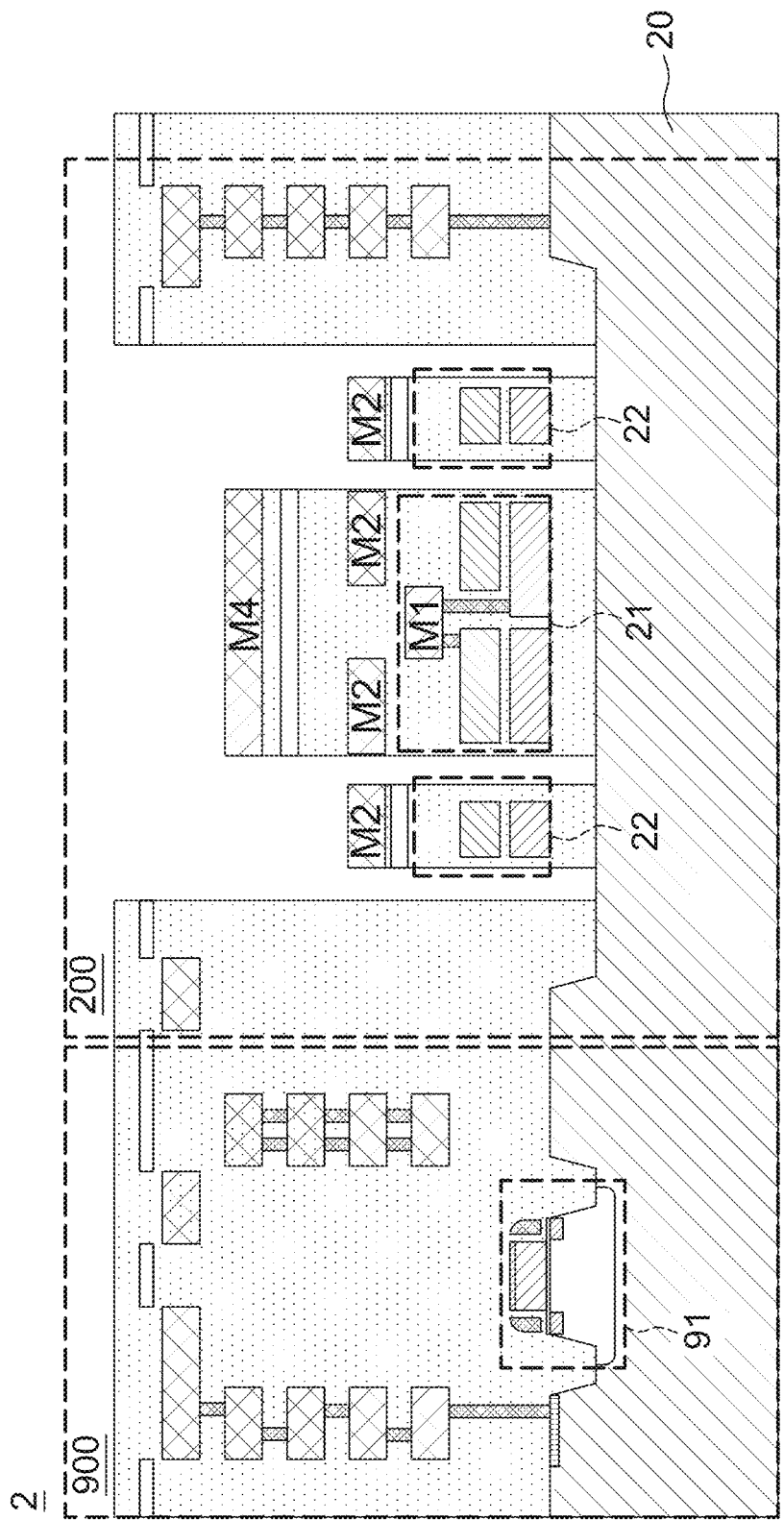

FIG. 3J shows a first etching process, e.g., using reactive ion etching (RIE). The first etching process etches from the upper surface of the dielectric layer 23 to the metal layer M2, the metal layer M4 and the substrate 20, and the photoresist layer 30 is then removed. In this process, the metal layer M2 and M4 are used as etch stop layers in the first etching process. The first etching process is, for example, a dry etching that has a higher etch rate to the dielectric layer 23 than to the metal layers M2 and M4.

FIG. 3J shows a second etching process, e.g., wet etching using tetra methyl ammonium hydroxide (TMAH) or potassium hydroxide (KOH), to remove the metal layer M2, the metal layer M4 and a part of the substrate 20 under the thermopile structure 21 such that the dielectric layer 23 is formed with two layers of heat absorption layers 231 and 233 between the thermopile structure 21 and the blocking layer 243, and the thermopile structure 21 is suspended. In the second etching process, the etching liquid has a higher etch rate to the metal layers M2 and M4 than to the dielectric layer 23. By removing the metal layer M2, a hollow space HS is formed inside the heat absorption layer.

The two-layer heat absorption layers include a first heat absorption layer 231, a second heat absorption layer 233 and a connection layer 232 connected between the first heat absorption layer 231 and the second heat absorption layer 233. In the present disclosure, a cross section of the connection layer 232 is smaller than cross sections of the first heat absorption layer 231 and the second heat absorption layer 233 so as to form a shape of dumbbells.

For example, if the thermopile structure 21 has a rectangular shape seeing from above, a cross section of the connection layer 121 is also a rectangle, but not limited thereto. The cross section of the connection layer 232 is possibly arranged as other shapes, e.g., a circle.

Figure 3K:
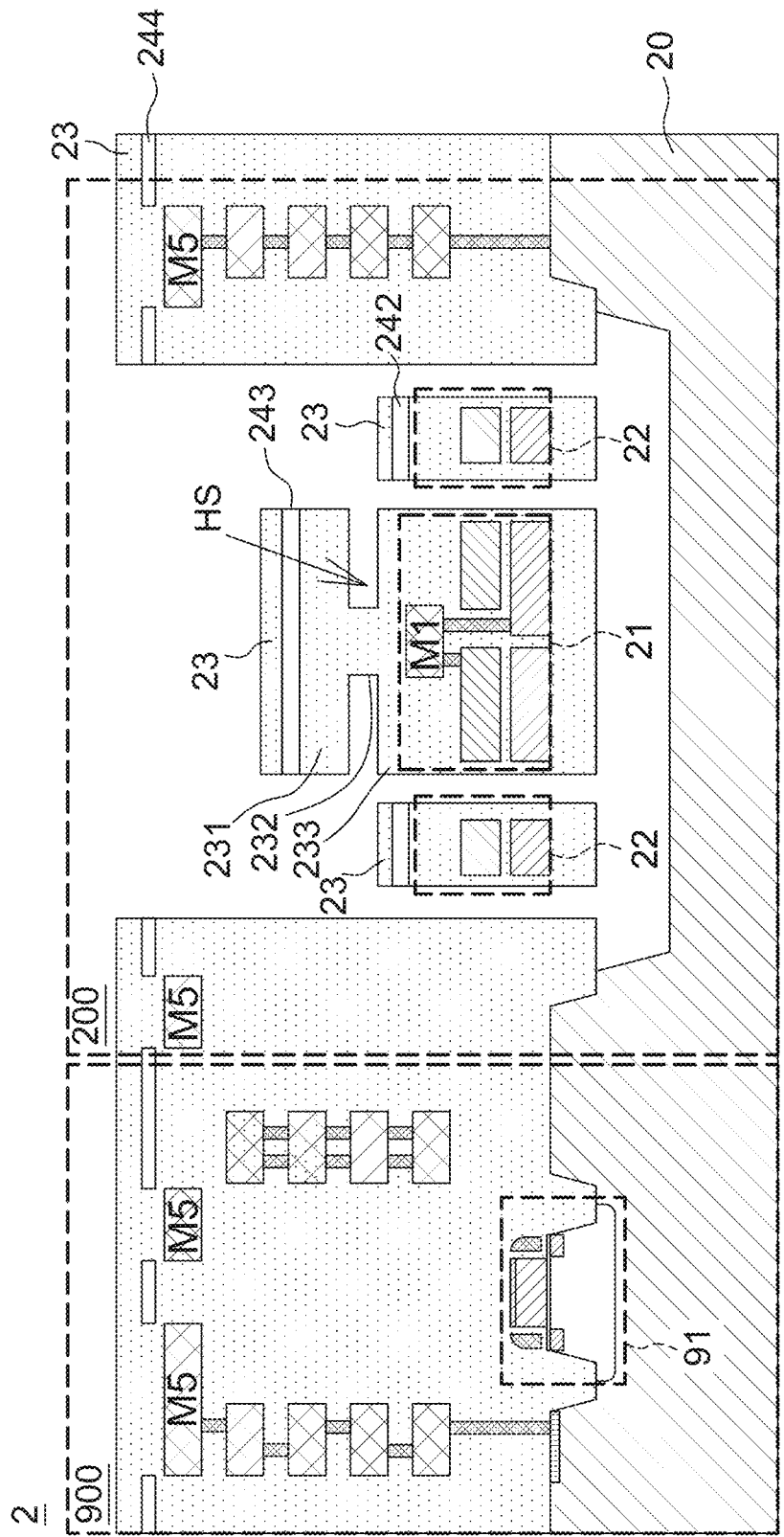

Finally, the structure in FIG. 3K is processed by a third etching process so as to remove dielectric layers 23 above the blocking layers 242, 243, 244 as well as above the metal layer M5 to form the FIR sensor 2 shown in FIG. 2. The third etching process is, for example, a dry etching (e.g., RIE) which has a higher etch rate to the dielectric layer 23 than to the metal layer M5 and the blocking layers 242, 243, 244. In this process, the metal layer M5 and the blocking layers 242, 243, 244 are used as etch stop layers in the third etching process.

In the present disclosure, a height of the blocking layer 243 (e.g., silicon nitride layer) in the longitudinal direction is preferably lower than a top layer among the metal layers M1 to M5. For example, FIG. 2 shows that the blocking layer 243 is between the metal layers M3 and M4 to further reduce the total volume of the heat absorption layer and improve the heat collection efficiency.

In the present disclosure, the arrangement and connection of the metal layers M1 to M5 are determined according to actual requirements, and are not limited to those shown in the present disclosure.

It should be mentioned that although the present disclosure is described in the way that the thermopile structure 21 is formed by two polysilicon layers, the present disclosure is not limited thereto. In other aspects, the two polysilicon layers are replaced by one metal layer and one polysilicon layer, or replaced by two metal layers as long as said two layers have different Seebeck coefficients.

It should be mentioned that although the present disclosure is described in the way that the thermopile structure 21 is formed by two polysilicon layers stacked in the up-down (or longitudinal) direction, the present disclosure is not limited thereto. In other aspects, the two polysilicon layers are in contact with each other in the transverse direction to form a transverse thermopile structure.

It is appreciated that a number of and the size of elements in every embodiment and drawing are only intended to illustrate but not to limit the present disclosure.

As mentioned above, because a volume of a heat absorption layer can influence the sensing efficiency, it is required to calibrate a structure of the heat absorption layer. Accordingly, the present disclosure further provides an FIR sensor with improved heat collecting efficiency by reducing the volume of the heat absorption layer (e.g., referring to FIG. 2) and a manufacturing method thereof (e.g., referring to FIGS. 3A to 3K) in which a sacrificial metal layer is arranged inside the heat absorption layer during the manufacturing process and the sacrificial metal layer is then removed before the manufacturing is accomplished so as to achieve the objective of reducing volume. Besides, the heat collecting efficiency is further increased by arranging multiple heat absorption layers and arranging a blocking layer upon the multiple heat absorption layers.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A far infrared (FIR) sensor, comprising:
   a substrate;
   a thermopile structure, arranged on the substrate;
   a heat absorption layer, covering upon the thermopile structure, and comprising a first heat absorption layer stacking on a second heat absorption layer, wherein the first heat absorption layer and the second heat absorption layer are connected by a connection layer, and a cross section of the connection layer is smaller than cross sections of the first heat absorption layer and the second heat absorption layer; and
   a peripheral circuit arranged on the substrate and the peripheral circuit comprising multiple metal layers, wherein the connection layer is aligned with one of the multiple metal layers in a transverse direction.

2. The FIR sensor as claimed in claim 1, wherein a width of the connection layer is smaller than 10 micrometers.

3. The FIR sensor as claimed in claim 1, wherein the cross section of the connection layer is smaller than 1/10 of the cross sections of the first heat absorption layer and the second heat absorption layer.

4. The FIR sensor as claimed in claim 1, wherein an upper surface of the first heat absorption layer is further arranged with a blocking layer as an etch stop layer.

5. The FIR sensor as claimed in claim 4, wherein the blocking layer is lower than a top layer among the multiple metal layers.

6. The FIR sensor as claimed in claim 1, wherein the thermopile structure comprises:
   a first polysilicon layer and a second polysilicon layer stacked to each other, wherein the first polysilicon layer and the second polysilicon layer have different Seebeck coefficients;
   a dielectric layer, sandwiched between the first polysilicon layer and the second polysilicon layer; and
   a metal layer, connected to the first polysilicon layer and the second polysilicon layer respectively using a via.

7. A far infrared (FIR) sensor, comprising:
   a substrate;
   a thermopile structure, arranged on the substrate; and
   a heat absorption layer, covering upon the thermopile structure, and comprising a hollow space formed after a metal layer in the heat absorption layer is etched,
   wherein an upper surface of the heat absorption layer is further arranged with a blocking layer as an etch stop layer.

8. The FIR sensor as claimed in claim 7, further comprising a peripheral circuit arranged on the substrate, and the peripheral circuit comprising multiple metal layers, wherein the hollow space is aligned with one of the multiple metal layers in a transverse direction.

9. The FIR sensor as claimed in claim 7, further comprising a peripheral circuit arranged on the substrate, and the peripheral circuit comprising multiple metal layers, wherein the hollow space is not aligned with any one of the multiple metal layers in a transverse direction.

10. The FIR sensor as claimed in claim 7, further comprising a peripheral circuit arranged on the substrate, and the peripheral circuit comprising multiple metal layers, wherein the blocking layer is lower than a top layer among the multiple metal layers.

11. A far infrared (FIR) sensor, comprising:
   a substrate;
   a thermopile structure, arranged on the substrate;
   a heat absorption layer, covering upon the thermopile structure, and comprising a first heat absorption layer stacking on a second heat absorption layer, wherein the first heat absorption layer and the second heat absorption layer are connected by a connection layer, and a cross section of the connection layer is smaller than cross sections of the first heat absorption layer and the second heat absorption layer; and
   a peripheral circuit arranged on the substrate and the peripheral circuit comprising multiple metal layers, wherein the connection layer is not aligned with any one of the multiple metal layers in a transverse direction.

* * * * *